(12) United States Patent
Antone et al.

(10) Patent No.: US 6,437,616 B1
(45) Date of Patent: Aug. 20, 2002

(54) DELAY LOCK LOOP WITH WIDE FREQUENCY RANGE CAPABILITY

(75) Inventors: James A. Antone, Austin, TX (US); Melvin W. Stene; Brian R. Kauffmann, both of Pocatello, ID (US)

(73) Assignee: AMI Semiconductor, Inc., Eastlake, OH (US)

( * ) Notice: Subject to any disclaimer, the term of this patent is extended or adjusted under 35 U.S.C. 154(b) by 43 days.

(21) Appl. No.: 09/741,317

(22) Filed: Dec. 19, 2000

(51) Int. Cl.[7] .............................. H03L 7/06; H03L 7/00; H03H 11/28
(52) U.S. Cl. ................. 327/158; 327/277; 331/DIG. 2; 331/17; 331/14; 331/15
(58) Field of Search ........................... 331/17, 1 A, 14, 331/15, DIG. 2; 327/157, 158, 159, 160, 277

(56) References Cited

U.S. PATENT DOCUMENTS

| | | | | |
|---|---|---|---|---|
| 4,309,673 A | * | 1/1982 | Norberg et al. | 332/112 |
| 4,338,569 A | * | 7/1982 | Petrich | 327/158 |
| 5,003,552 A | * | 3/1991 | Mower | 375/140 |
| 5,699,020 A | * | 12/1997 | Jefferson | 331/17 |
| 6,028,903 A | * | 2/2000 | Drost et al. | 375/360 |
| 6,285,219 B1 | * | 3/2000 | Pauls | 327/3 |

* cited by examiner

Primary Examiner—N. Le
Assistant Examiner—Wasseem H. Hamdan
(74) Attorney, Agent, or Firm—Alan H. MacPherson; MacPherson Kwok; Heid LLP

(57) ABSTRACT

A delay lock loop circuit is disclosed which includes a delay block which receives the clock signal and delays the clock signal by a selected amount to generate the delayed clock signal. A phase detector receives the clock signal and the delayed clock signal, compares the phases of the two signals and generates a phase comparison signal. A lock detector receives the clock signal and the delayed clock signal, compares the timing of the two signals and generates a potential lock indication signal. A controller receives the phase comparison signal and the potential lock indication signal and provides a delay control signal to the delay block to change the selected delay amount in response to the phase comparison signal. The controller interrupts the clock signal to the delay block for a selected interval in response to the potential lock indication signal, and generates a true lock indication signal in response to the potential lock indication signal after the interruption of the clock signal to the delay block. The delay lock loop circuit is capable of handling a wide range of clock frequencies and a step increase or decrease in the clock frequency.

6 Claims, 10 Drawing Sheets

DELAY LOCK LOOP WITH WIDE FREQUENCY RANGE CAPABILITY

TECHNICAL FIELD OF THE INVENTION

The present invention relates to delay lock loops, and in particular to a delay lock loop with wide frequency range capability.

BACKGROUND OF THE INVENTION

Delay lock loops are known in which a delayed clock signal is generated with a selected phase delay (e.g. 360°) from the original clock signal. The circuitry which acquires a "lock" on the desired phase delay typically is designed to operate within a limited frequency range of perhaps an octave or less, and may not be capable of acquiring a lock on a clock signal outside this frequency range. Moreover, a step increase in clock frequency while a conventional delay lock loop is operating may result in the delay lock loop acquiring a false lock on the signal, or in other words locking on to a phase delay other than the desired phase delay. A false lock is particularly likely when the new clock frequency is an integer multiple of (e.g. two or three times) the original clock frequency. A step increase in clock frequency may also cause a conventional delay lock loop to enter a state of instability, which is defined as a state in which the delay lock loop oscillates between searching for a lock and reaching terminal delay limits. These limitations of conventional delay lock loops may limit the applications in which delay lock loops may be used, or may place burdensome design constraints on the circuits to be used with a delay lock loop.

SUMMARY OF THE INVENTION

Thus, a need has arisen for a delay lock loop that addresses the disadvantages and deficiencies of the prior art. Accordingly, a delay lock loop with wide frequency range capability is disclosed. In one embodiment, the delay lock loop circuit includes a delay block which receives the clock signal and delays the clock signal by a selected amount to generate the delayed clock signal. A phase detector receives the clock signal and the delayed clock signal, compares the phases of the two signals and generates a phase comparison signal. A lock detector receives the clock signal and the delayed clock signal, compares the timing of the two signals and generates a potential lock indication signal, A controller receives the phase comparison signal and the potential lock indication signal and provides a delay control signal to the delay block to change the selected delay amount in response to the phase comparison signal. The controller interrupts the clock signal to the delay block for a selected interval in response to the potential lock indication signal, and generates a true lock indication signal in response to the potential lock indication signal after the interruption of the clock signal to the delay block.

A technical advantage of the present invention is that the delay lock loop circuit is capable of reliably and accurately handling an instantaneous change in the clock frequency.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 9 of the drawings. Like numerals are used for like and corresponding parts of the various drawings.

Figure 1:
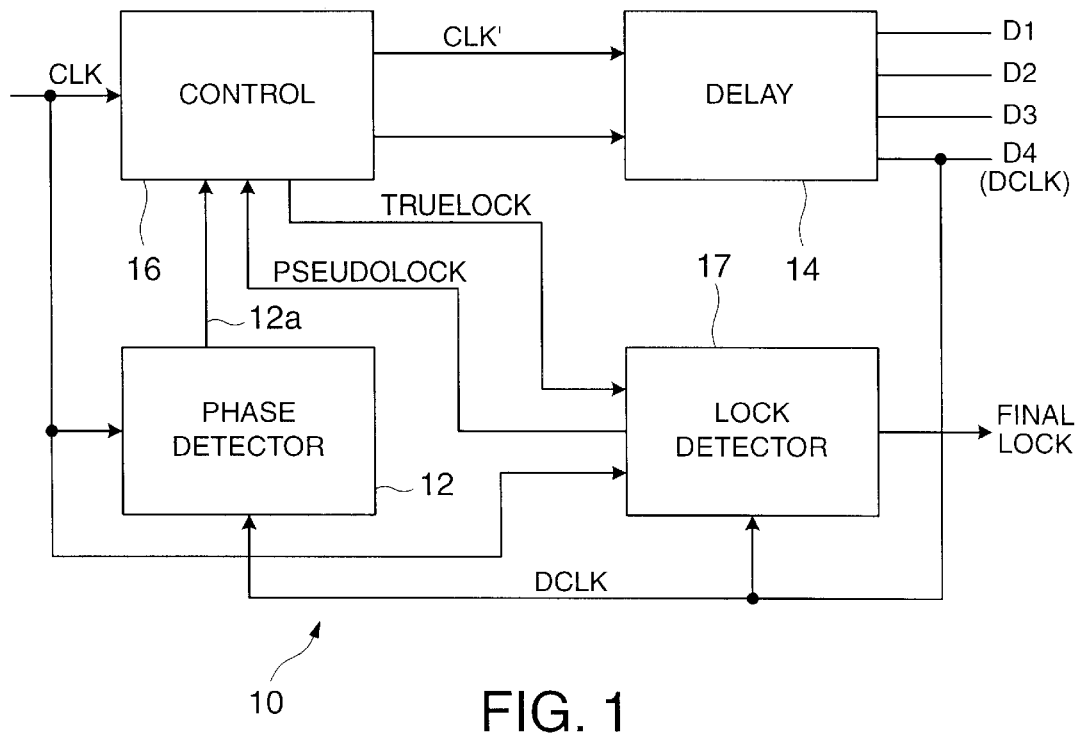
FIG. 1 is a block diagram of a delay lock loop circuit in accordance with the present invention.

Referring to FIG. 1, a block diagram of a delay lock loop circuit 10 is shown. Delay lock loop circuit 10 includes a phase detector 12, a delay block 14, control logic 16 and a lock detector 17. Phase detector 12 receives a clock signal CLK from a clock signal source (not shown) and a delayed clock signal DCLK from delay block 14. The delayed clock signal DCLK may be, for example, delayed by 360 degrees from the clock signal CLK. By comparing the phases of the two clock signals CLK and DCLK, phase detector 12 determines whether the amount of delay generated by delay block 14 should be increased or decreased. Control logic 16 controls delay block 14 accordingly.

Delay block 14 generates four delayed clock signals D1, D2, D3 and D4. Each delayed clock signal may represent a clock signal shifted by a multiple of 90° from the original clock signal CLK. Thus, signal D1 is delayed 90°, signal D2 is delayed 180°, signal D3 is delayed 270° and signal D4 is delayed 360° from clock signal CLK. Signal D4 is used as the delayed clock signal DCLK for feedback to phase detector 12.

Lock detector 17 also receives clock signals CLK and DCLK signals. Lock detector 17 compares the two signals and determines when delay block 14 has acquired a "lock" on the desired 360° phase delay (or a harmonic thereof).

Figure 2:
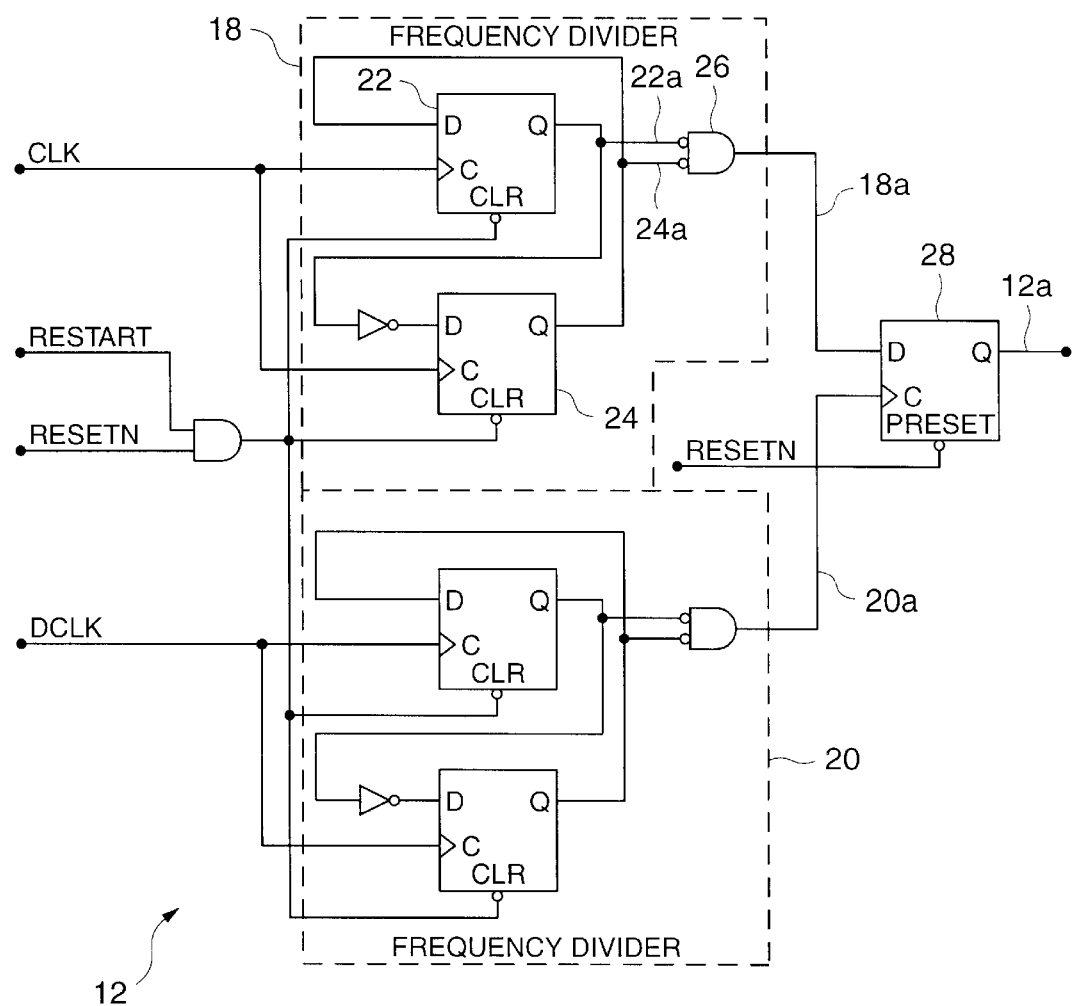
FIG. 2 is a logic-level schematic diagram of a phase detector for use in the delay lock loop circuit.

Referring to FIG. 2, a logic-level schematic diagram of phase detector 12 is shown. Phase detector 12 includes a clock signal frequency divider 18 and a delayed clock signal frequency divider 20. These two frequency dividers 18 and 20 act on the clock signal CLK and the delayed clock signal DCLK, respectively. These frequency dividers 18 and 20 are identical in structure and function. Thus, only the design of clock signal frequency divider 18 will be described in detail.

Clock signal frequency divider 18 includes two rising edge triggered D flip flops 22 and 24. The output signal 22a of flip flop 22 is inverted and provided to the data input terminal D of flip flop 24, while the output signal 24a of flip flop 24 is provided without inversion to the data input terminal D of flip flop 22. Both flip flops 22 and 24 receive as a clock input the clock signal CLK. It will be readily appreciated that this arrangement of flip flops 22 and 24 cycles through four states as shown in Table A. For each state in Table A, a high logic level signal is indicated by "H" while a low logic level signal is indicated by "L." Each state lasts for one complete cycle of the clock signal CLK. After assuming State 4, flip flops 22 and 24 return to State 1 and begin the cycle again.

TABLE A

| State | Signal 22a | Signal 24b |
| --- | --- | --- |
| 1 | H | H |
| 2 | H | L |
| 3 | L | L |
| 4 | L | H |

The flip flop output signals 22a and 24a are provided to an AND gate 26 with inverted inputs, which is logically equivalent to a NOR gate. This AND gate 26 generates a frequency divider output signal 18a. A similar output signal 20a is generated by delayed clock signal frequency divider 20, which performs frequency division on the delayed clock signal DCLK.

Output signal 20a from delayed clock signal frequency divider 20 is provided to a rising edge-triggered D flip flop 28 as a clock input. Output signal 18a from clock signal frequency divider 18 is provided to flip flop 28 as a data input. Flip flop 28 generates the phase detector output signal 12a.

Figure 3:
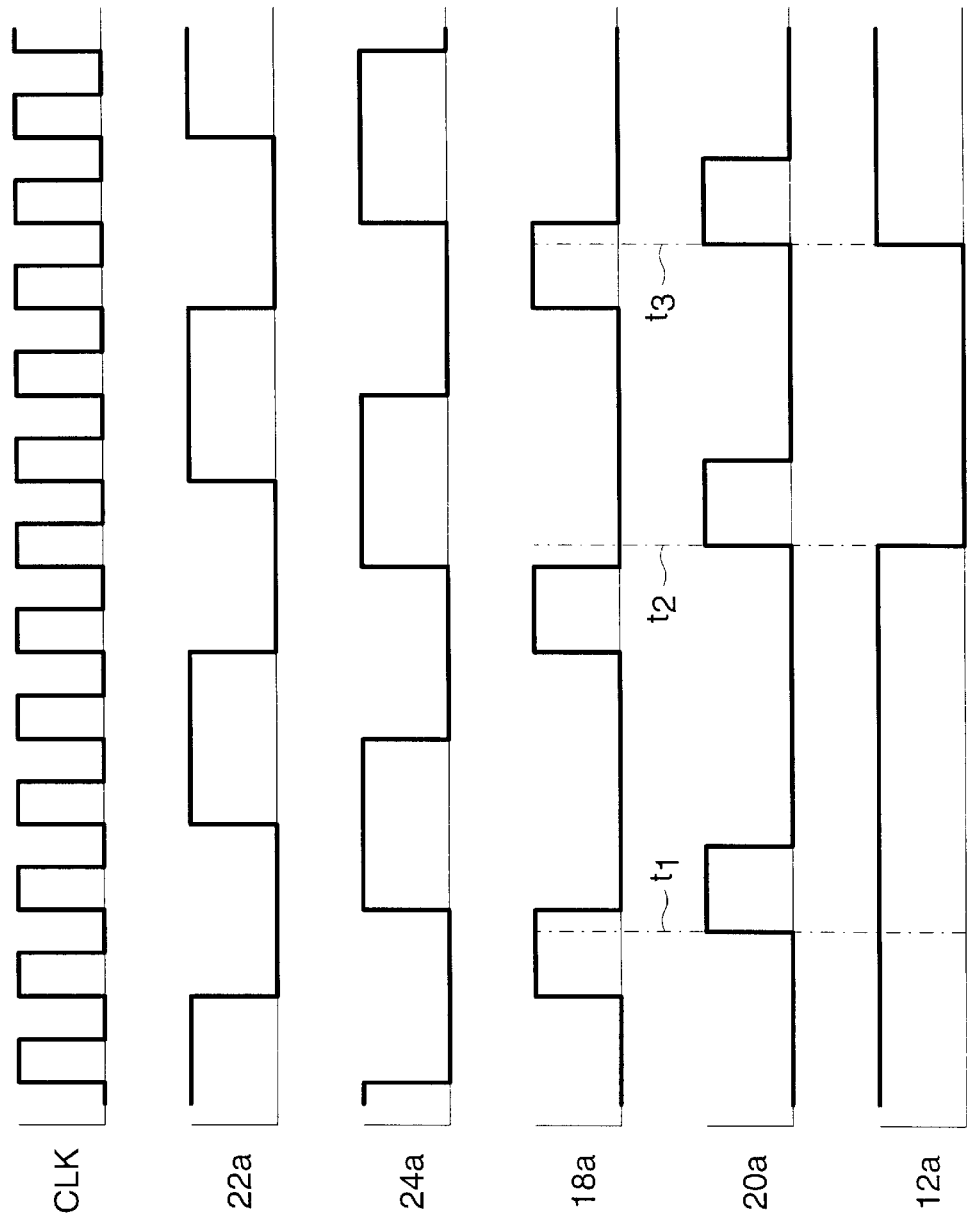
FIG. 3 is a timing diagram illustrating the operation of the phase detector.

Referring to FIG. 3, a timing diagram illustrating the operation of phase detector 12 is shown. Clock signal CLK in this example is a square-wave clock signal with an unchanging frequency. Signals 22a and 24a cycle through the four states set forth in Table A in response to the clock signal CLK. Frequency divider output signal 18a is high whenever both signals 22a and 24a are low. Thus, frequency divider output signal 118a is high for one complete cycle out of every four cycles of clock signal CLK. The rising edge of frequency divider output signal 18a is aligned with the rising edge of clock signal CLK.

Similarly, output signal 20a generated by delayed clock signal frequency divider 20 is high for one complete cycle out of every four cycles of delayed clock signal DCLK (not shown). he rising edge of output signal 20a is aligned with the rising edge of delayed clock signal CLK.

Phase detector output signal 12a is a sample of signal 18a on the rising edge of signal 20a. When delayed clock signal DCLK trails clock signal CLK by 360°, the rising edge of signal 20a is approximately aligned with the falling edge of signal 18a. Thus, if the rising edge of signal 20a occurs while signal 18a is high (resulting in signal 12a being high), more delay should be added to delayed clock signal DCLK. Conversely, if the rising edge of signal 20a occurs while signal 18a is low (resulting in signal 12a being low), the delay of delayed clock signal DCLK should be shortened. Phase detector output signal 12a therefore provides an indication of whether delay should be added to or subtracted from delay block 14 (shown in FIG. 1).

The timing diagram of FIG. 3 illustrates a situation in which delay lock loop circuit 10 is reaching the desired 360° phase delay. Assuming that delay block 14 initially introduces a minimal phase delay for delayed clock signal DCLK, phase detector output signal 12a will remain at a high logic level, causing delay block 14 to steadily increase its delay time. At time $t_1$, the rising edge of signal 20a still occurs while signal 18a is high, indicating that the delay has not yet reached the desired value of 360°. Thus, phase detector output signal 12a remains high, causing the phase delay to be increased further. At time $t_2$, the rising edge of signal 20a occurs after signal 18a has transitioned to a low logic level, indicating that the delay has exceeded the desired value of 360°. Thus, phase detector output signal 12a goes low, causing the phase delay to be decreased. At time $t_3$, the rising edge of signal 20a occurs while signal 18a is high, so that phase detector output signal 12a goes high, causing the phase delay to be increased In this manner, the phase delay introduced by delay block 14 dithers around the desired value of 360°. (The magnitude of the phase deviation caused by this dithering is exaggerated in FIG. 3 for purposes of illustration. Moreover, this dithering may be reduced in both magnitude and frequency by delay control logic as described below.)

The use of frequency dividers 18 and 20 in phase detector 12 enables phase detector 12 to handle significant changes in input clock frequency during operation. In the example described above, frequency dividers with a division factor of four were used. Delay lock loop circuit 10 may therefore be presented with a step increase .(or decrease) in clock frequency by a factor of three without becoming unreliable or unstable, as would occur in conventional delay lock loops. Frequency division factors greater than four may be used in phase detector 12, which would enable delay lock loop circuit 10 to handle even greater changes in input clock frequency. A higher frequency division factor generally increases the time required for delay lock loop circuit 10 to acquire lock. Thus, a frequency division factor may be chosen as a compromise between input clock frequency range capability and time-to-lock.

Figure 4:
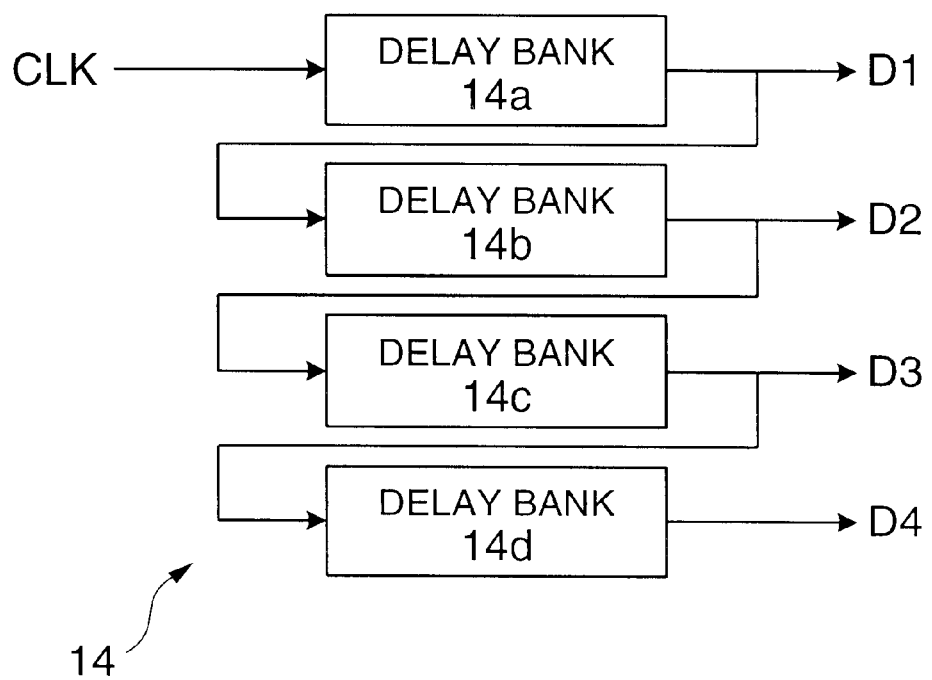
FIG. 4 is a block diagram of a delay block for use in the delay lock loop circuit.

Referring to FIG. 4, a block diagram of delay block 14 is shown. Delay block 14 includes four delay banks 14a, 14b, 14c and 14d. Each delay bank delays its input signal by a nominal 90°. Delay bank 14a receives the clock signal CLK as its input. The first three delay banks 14a, 14b and 14c produce delayed clock signals D1, D2 and D3, respectively, which are each provided to a subsequent delay bank in delay block 14 as an input signal. Delay bank 14d generates delayed clock signal D4, also referred to as DCLK, which is delayed by 360° from the clock signal CLK.

Figure 5:
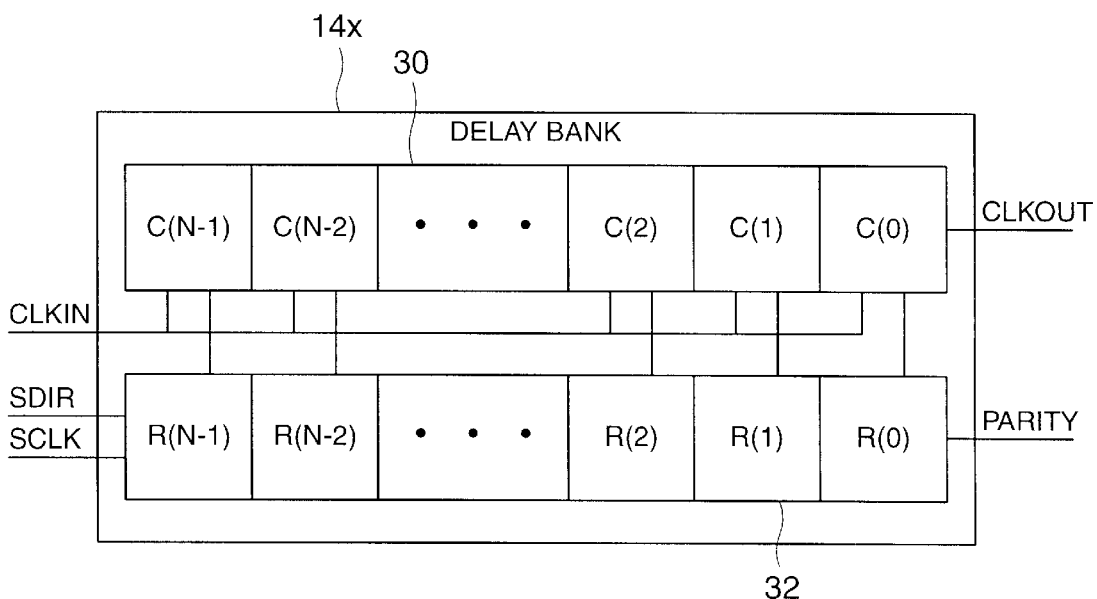
FIG. 5 is a bloc diagram of a delay bank in the delay block.
Figure 10:
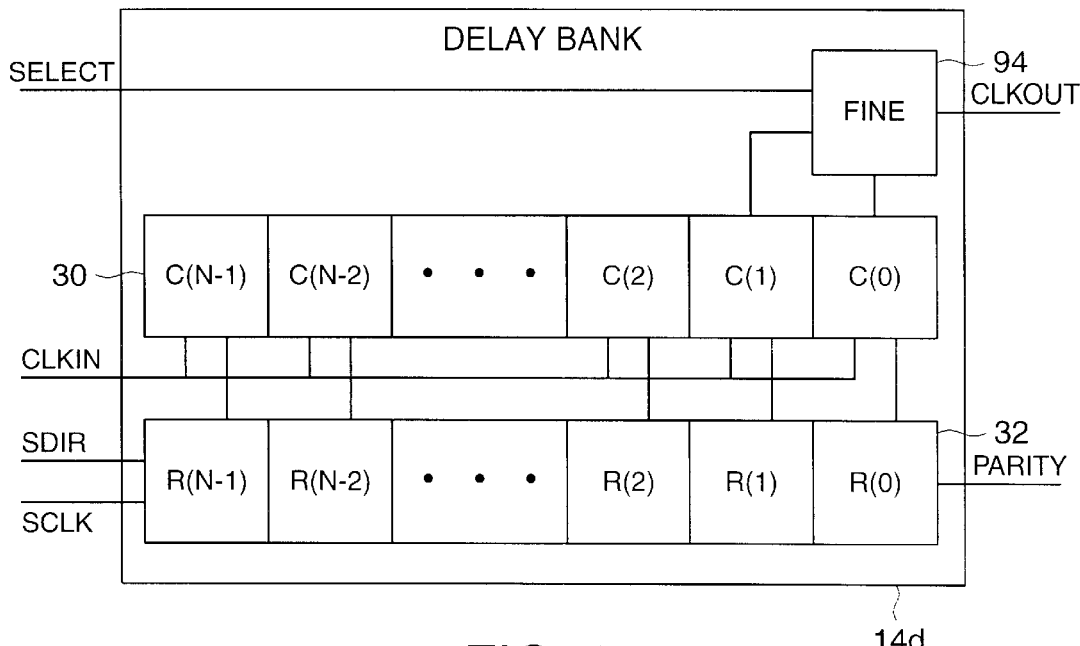
FIG. 10 is a block diagram of a delay bank in the delay block.

Referring to FIG. 5, a block diagram of a delay bank 14x is shown. This delay bank 14x represents any one of the delay banks 14a, 14b and 14c shown in FIG. 4 (a separate block diagram for delay bank 14d is shown in FIG. 10, described below). The clock input signal CLKIN represents the appropriate clock input signal (CLK, D1, D2 or D3) for the delay bank 14x. Likewise, clock output signal CLKOUT represents the appropriate clock output signal (D1, D2 or D3) for the delay bank 14x.

Delay bank 14x includes a delay cell chain 30 and a shift register 32. Delay cell chain 30 consists of a sequence of N delay cells C(i). In one embodiment, each delay cell C(i) delays its input signal by 200 picoseconds, and there are N=130 delay cells C(i) per bank. Shift register 32 has a corresponding sequence of N storage locations R(i). The value stored in each storage location R(i) is provided as a select signal S(i) to the corresponding delay cell C(i).

Shift register 32 is a "one-hot" shift register, meaning that one and only one of the select signals S(i) is at a high logic level, while the rest of the select signals S(i) are at a low logic level. The one delay cell C(i) which is selected by shift register 32 with a high logic level select signal S(i) serves as the point of entry for the clock input signal CLKIN into delay cell chain 30. From this point of entry, the clock input signal CLKIN is passed to each subsequent delay cell C(i) in succession. Thus, for example, if delay cell C(2) is the one cell selected by shift register 32, then the clock input signal CLKIN enters delay cell chain 30 at delay cell C(2). (All upstream delay cells C(3) through C(N−1) ignore the clock input signal CLKIN.) The clock input signal CLKIN is then delayed by delay cells C(2), C(1) and C(0) in succession, and is provided as the clock output signal CLKOUT. The clock input signal CLKIN is provided to every delay cell C(i) for potential entry into delay cell chain 30.

Shift register 32 receives a shift direction signal SDIR and a shift clock signal SCLK from control logic 16. Shift direction signal SDIR indicates whether a shift to the left or right is to be performed (thereby increasing or decreasing, respectively, the delay time of delay bank 14x), while shift clock signal SCLK indicates when the shift is to be performed. The means by which such a shift is carried out is described below.

Figure 6:
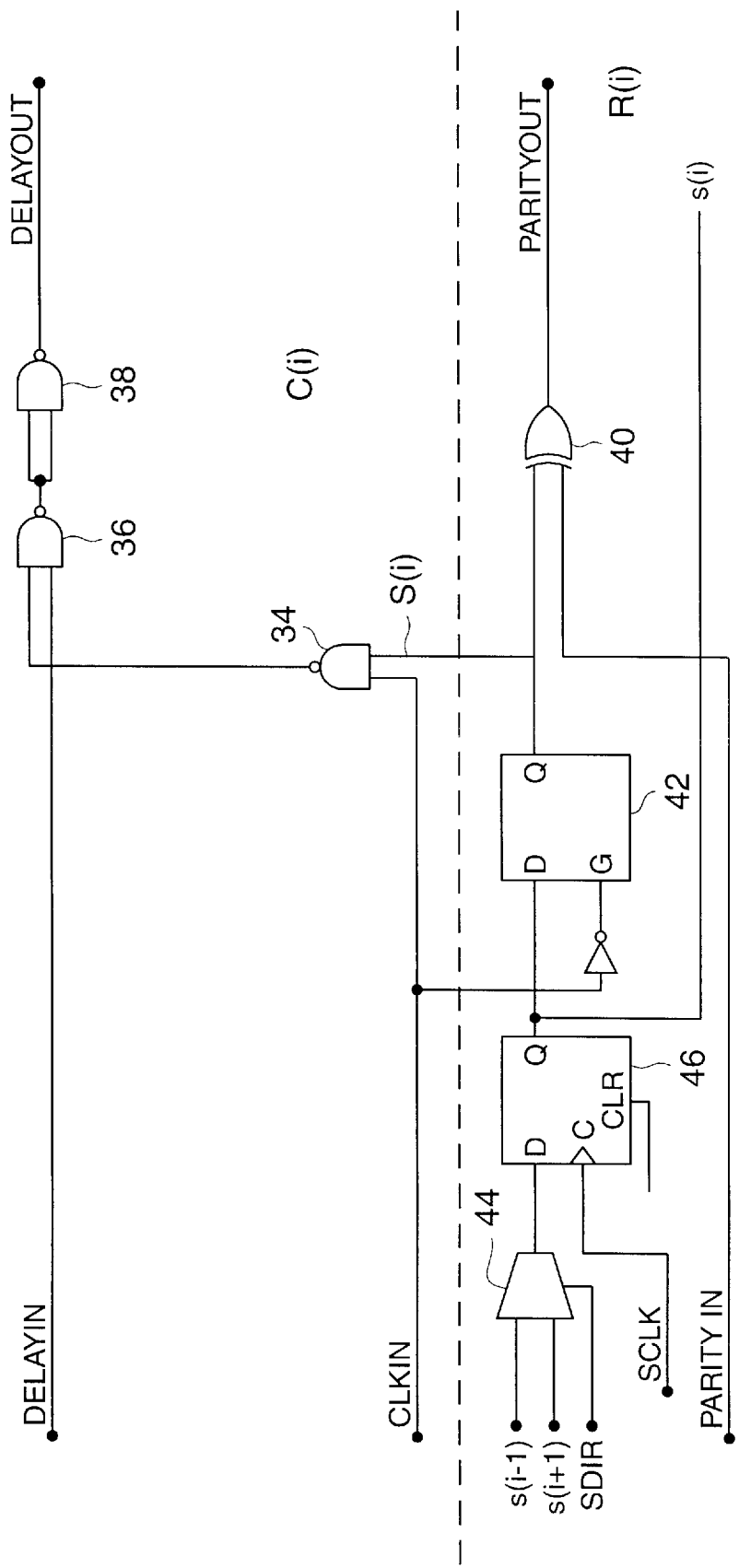
FIG. 6 logic-level schematic diagram of a delay cell and its corresponding shift register storage location.

Referring to FIG. 6, a logic-level schematic diagram of a delay cell C(i) and its corresponding shift register storage location R(i) is shown. In the delay cell C(i), the clock input signal CLKIN and the select signal S(i) are provided to a NAND gate 34. If the select signal S(i) is low, then the output of NAND gate 34 is high. If the select signal S(i) is high, then the output of NAND gate 34 is an inversion of the clock input signal CLKIN.

The output signal from NAND gate 34 is provided as an input to a second NAND gate 36. The other input to NAND gate 36 is the DELAYIN signal. For delay cells C(0) through C(N−2), this DELAYIN signal is the output signal (DELAYOUT) from the delay cell (C(i+1)) immediately upstream (to the left in FIG. 5) of the delay cell C(i) in question. In the first delay cell C(N−1) of a delay bank, the DELAYIN signal is tied high.

The output of NAND gate 36 is provided to both inputs of another NAND gate 38, which acts as an inverter. (Alternatively, on input of NAND gate 38 may be tied high with the same result.) Together, NAND gates 36 and 38 form the delay element of delay cell C(i).

Since the shift register storage location R(i) forms part of a one-hot shift register 32, if the select signal S(i) is high, then all other select signals S(j≠i) are low. As a result, the DELAYIN signal for delay cell C(i) will be high whenever the select signal S(i) is high. Thus, when the select signal S(i) is high, the clock input signal CLKIN is inverted by NAND gates 34, 36 and 38 in succession, and is provided as the output signal DELAYOUT of delay cell C(i). The delay cell C(i) with a high select signal S(i) therefore acts as the entry point for the clock input signal CLKIN into delay cell chain 30.

If the select signal S(i) is low, the output of NAND gate 34 is high. This means that the DELAYIN signal will be provided (after a delay caused by NAND gates 36 and 38) as the output signal DELAYOUT of delay cell C(i). In this case, a select signal S(j≠i) for another delay cell C(j≠i) is high, setting the entry point for the clock input signal CLKIN into delay cell chain 30. If the clock input signal CLKIN enters the delay cell chain 30 downstream of delay cell C(i), then both the DELAYIN and DELAYOUT signals of delay cell C(i) will be high at all times. If the clock input signal CLKIN enters the delay cell chain 30 upstream of delay cell C(i), then the DELAYIN signal will be a delayed version of the clock input signal CLKIN. In this case, the DELAYIN signal will be provided (after a delay caused by NAND gates 36 and 38) as the output signal DELAYOUT of delay cell C(i).

Shift register 32 includes parity check logic to ensure that one and only one of the shift register outputs S(i) is high. Thus, storage location R(i) receives a PARITYIN signal which represents an exclusive-OR of the select signals S(i) from all upstream storage locations R(j>i) in shift register 32. Select signal S(i) and the PARITYIN signal are both provided as inputs to an XOR gate 40. The resulting output signal (PARITYOUT) is then provided as the PARITYIN signal for the next storage location R(i−1) in shift register 32. If exactly one select signal S(i) from shift register 32 is high, then the final parity output signal from shift register 32 will also be high. If either zero or two select signals S(i) are high, then the final PARITY output signal from shift register 32 will be low. Thus, for example, if a radiation event or some other transient malfunction causes one of the select signals S(i) to momentarily attain an improper value, this will be detected in the PARITY output from shift register 32 so that delay lock loops circuit may be reset. Of course, this parity logic is unable to detect an event in which an even number (e.g. two) of select signals S(i) simultaneously attain an improper value, but such an event is very unlikely.

Storage location R(i) in shift register 32 includes a latch 42 for holding the current select signal S(i) for storage location R(i). In this embodiment, latch 42 is a rising edge-triggered D flip flop. The clock input signal CLKIN is inverted and provided to the clock input of latch 42. An unclocked select signal s(i) is provided to the data input of latch 42. This clocking arrangement prevents the select signal S(i) from changing while the clock input signal CLKIN is high, and thereby prevents transitions in the DELAYOUT signal in the middle of a clock cycle. The generation of the unclocked select signal s(i) will be described below.

Shift register 32 includes shift logic allowing a shift of all stored values to the left or right within shift register 32. This shift logic includes logic at each storage location R(i) allowing the storage location R(i) to assume the value stored by an adjacent storage location R(i+1) or R(i−1). his logic includes a multiplexer 44 and flip flop 46 at each storage location R(i). Multiplexer 44 receives the unclocked select signals s(i+1) and s(i−1) from the two adjacent shift register locations R(i+1) and R(i−1), respectively. (Each storage location R(i) makes its unclocked select signal s(i) available to adjacent memory locations R(i−1) and R(i+1) for this purpose.)

The select signal for multiplexer 44 is the shift direction signal SDIR. Thus, for example, if the shift direction signal SDIR is high, indicating that a shift to the left is desired, then signal s(i−1) is selected by multiplexer 44. Conversely, if the shift direction signal SDIR is low, indicating that a shift to the right is desired, then signal s(i+1) is selected by multiplexer 44. In either case, the selected signal is passed on to the data input of D flip flop 46, which latches the data input on the rising edge of the SCLK signal.

Thus, when a shift is to be performed, a single positive pulse is transmitted on the SCLK signal, which is normally low. As a result, each unclocked select signal s(i) assuming the value of either s(i−1) or s(i+1). On the next falling edge of the clock input signal CLKIN, this new value of s(i) is assumed by the clocked select signal S(i). In this manner, the one high logic level signal of shift register 32 may be shifted to the left or right to increase or decrease, respectively, the amount of delay generated by delay bank 14x (shown in FIG. 5).

The SCLK and SDIR signals which control the timing and direction of the shift register transitions are generated by control logic 16 (shown in FIG. 1). These signals may be generated by any suitable logic in response to the output signal from phase detector 12, which indicates whether more or less delay is desired in delay block 14.

Referring to FIGS. 1 and 4, control logic 16 may be designed to. increase or decrease the delay in one delay bank at a time. Thus, for example, if output signal 12a from phase detector 12 remains high, indicating that an increase in signal delay is needed, the delay of delay bank 14d is increased first, followed by increases at delay banks 14c, 14b and 14a in subsequent cycles. If a further increase in signal delay is needed, the cycle begins again with an increase at delay bank 14d. Decreases in signal delay may be implemented in reverse order, starting with the delay bank most recently increased. In this manner, all delay banks 14a through 14d maintain the same delay interval (within 200 picoseconds), while the overall signal delay for the D4 (DCLK) signal may be incremented or decremented by 200 picosecond intervals. A simple state machine or other readily generated logic of conventional design may be used in control logic 16 to control the incrementing and decrementing of the delay banks 14x in this fashion.

It will be appreciated that the portions of delay lock loop circuit 10 described above provide a means for acquiring or "locking" on to a 360° clock signal delay. Importantly, control logic 16 and lock detector 17 also provide the capability to determine when a 360° lock has been achieved, and to determine when a "false lock" has been acquired.

A false lock occurs when delay block 14 generates delayed clock signal DCLK with a phase delay that is some multiple of 360°. For example, if delay block 14 delays clock signal CLK by 720° or 1080° to generate delayed clock signal DCLK, then phase detector 12, using the methods described above, will simply cause delay lock loop circuit 10 to register a false lock on this improper phase delay. This false lock is likely to occur when the frequency of clock signal CLK changes suddenly, particularly if the clock frequency changes to a harmonic of the initial frequency (e.g. double or triple the initial frequency).

To avoid a false lock of this type, lock detector 17 must first determine when a potential lock (also called "pseudolock," which is different from "false lock") has been acquired. This pseudolock or potential lock may then be tested by control logic 16 to determined when a true lock on the verified 360° phase delay has been acquired.

Figure 7:
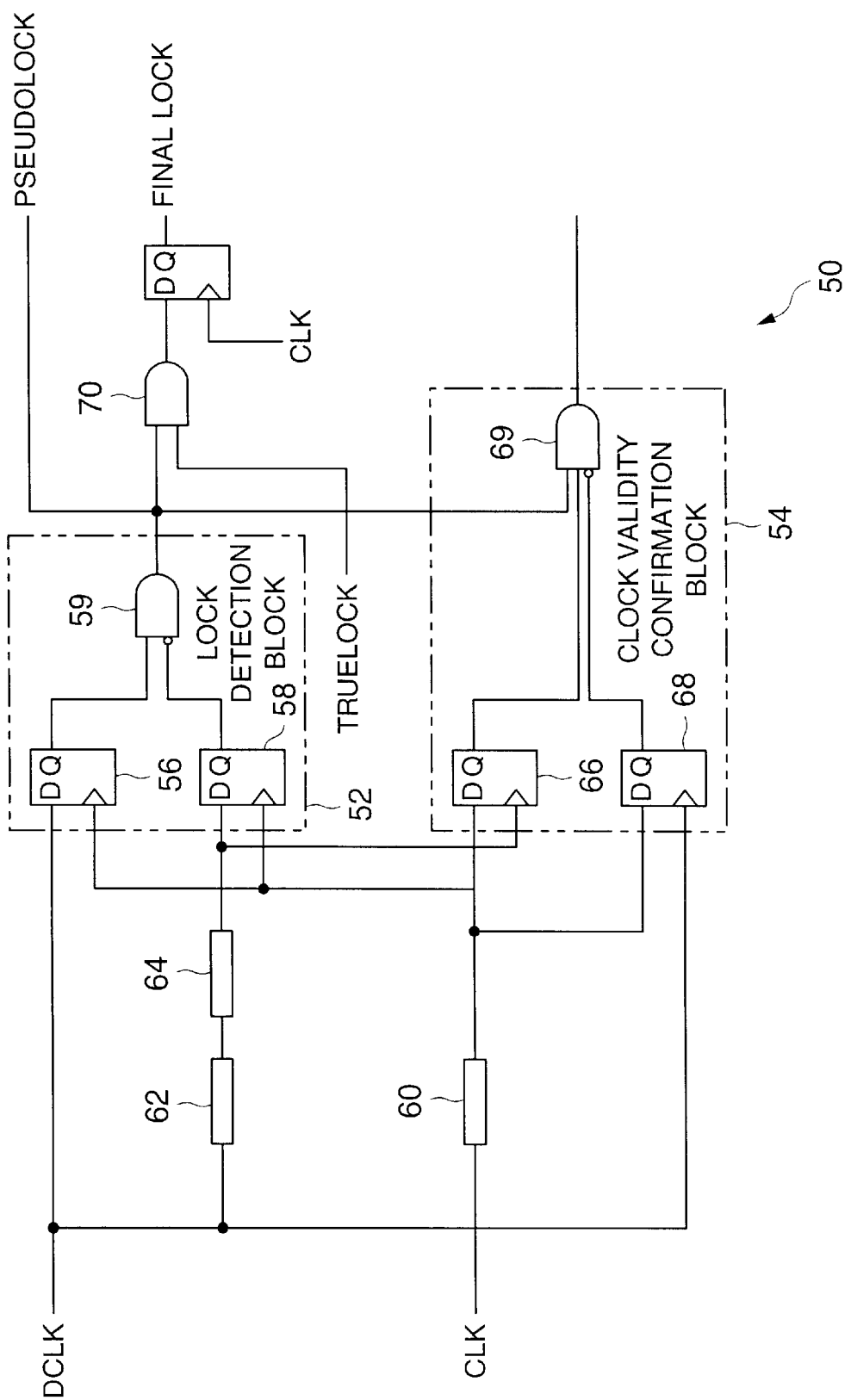
FIG. 7 is a logic-level schematic diagram of a lock detector for use in the delay lock loop circuit.

Referring to FIG. 7, a logic-level schematic diagram of lock detector 17 is shown. Lock detector 17 determines whether the clock signal CLK and the delayed clock signal DCLK have the desired phase relationship (i.e. 360° out of phase). To do this, lock detector 17 determines whether the rising edges of the two signals occur within a selected time frame, as described below. Lock detector 17 therefore actually determines whether a pseudolock (rather than true lock) has been acquired. A method for testing the pseudolock to determine whether it is a true lock will be described below.

Lock detector 17 includes a lock detection block 52 and a clock validity confirmation block 54. Lock detection block 52 includes two D flip flops 56 and 58 and an AND gate 59.

Clock signal CLK is delayed by a delay cell 60 and provided to the clock inputs of flip flops 56 and 58. Delay cell 60 delays clock signal CLK by an amount equal to the detection interval of lock detector 17. This unit of time will be referred to herein as a "delay interval," and is assumed to be much shorter than the period of the clock signal CLK. For example, a delay interval of 200 picoseconds may be used.

Delayed clock signal DCLK is provided without delay to the data input of flip flop 56. Delayed clock signal DCLK is also provided to the data input of flip flop 58 after being delayed for two delay intervals by delay cells 62 and 64.

If the rising edge of clock signal CLK occurs less than one delay interval before the rising edge of delayed clock signal DCLK, then the clock input of flip flop 56 rises after its data input rises. Flip flop 56 therefore generates a high output signal. Similarly, if the rising edge of clock signal CLK occurs less than one delay interval after the rising edge of delayed clock signal DCLK, then the clock input of flip flop 58 rises before its data input rises, and flip flop 58 generates a low output signal. Thus, if the rising edges of CLK and DCLK occur within one delay interval of each other, the output of flip flop 56 is high and the output of flip flop 58 is low.

The output of flip flop 56 is provided to a noninverting input of AND gate 59. The output of flip flop 58 is provided to an inverting input of AND gate 59. Thus, if the rising edges of CLK and DCLK occur within one delay interval of each other, the output of AND gate 59 is high. This output signal (PSEUDOLOCK) is the pseudolock detection signal of lock detector 17.

As will be apparent from the above description, lock detection block 52 provides a valid pseudolock detection signal so long as both clock signals CLK and DCLK continue to operate. However, if pseudolock is acquired (i.e. the output of AND gate 59 is high) and clock signal CLK is lost (i.e. CLK ceases to oscillate) as a result of a failure, flip flops 56 and 58 will continue to hold their values, and lock detection block 52 will continue to register a pseudolock.

To avoid this potential problem, clock validity confirmation block 54 confirms that clock signal CLK is still operating. Like lock detection block 52, clock validity confirmation block 54 includes two flip flops 66 and 68 and an AND gate 69. Delayed clock signal DCLK is provided to the clock input of flip flop 68 without delay, and to the clock input of flip flop 66 after a delay of two delay intervals. Clock signal CLK is provided to the data inputs of flip flops 66 and 68 after a delay of one delay interval.

If the rising edge of clock signal CLK occurs-less than one delay interval after the rising edge of delayed clock signal DCLK, then the clock input of flip flop 66 rises after its data input rises. Flip flop 66 therefore generates a high output signal. Similarly, if the rising edge of clock signal CLK occurs less than one delay interval before the rising edge of delayed clock signal DCLK, then the clock input of flip flop 68 rises before its data input rises, and flip flop 68 generates a low output signal. Thus, if the rising edges of CLK and DCLK occur within one delay interval of each other, the output of flip flop 66 is high and the output of flip flop 68 is low.

The output of flip flop 66 is provided to a noninverting input of AND gate 69. The output of flip flop 68 is provided to an inverting input of AND gate 69. The output signal of AND gate 59 is provided to a third, noninverting input of AND gate 69. Thus, if the rising edges of CLK and DCLK occur within one delay interval of each other, the output of AND gate 69 is high.

If clock signal CLK fails after lock is acquired, lock detection block 52 will continue to generate a high output signal, but clock validity confirmation block 54 will generate a low output signal. If delayed clock signal DCLK fails after lock is acquired, lock detection block 52 will generate a low output signal, thereby preventing clock validity confirmation block 54 from generating a high output signal. The output signal from clock validity confirmation block 54 therefore represents a combined lock and clock validity signal. This signal may be provided to external circuitry (not shown) using delay lock loop circuit 10 to confirm the validity and functionality of clock signal CLK.

Figure 8:
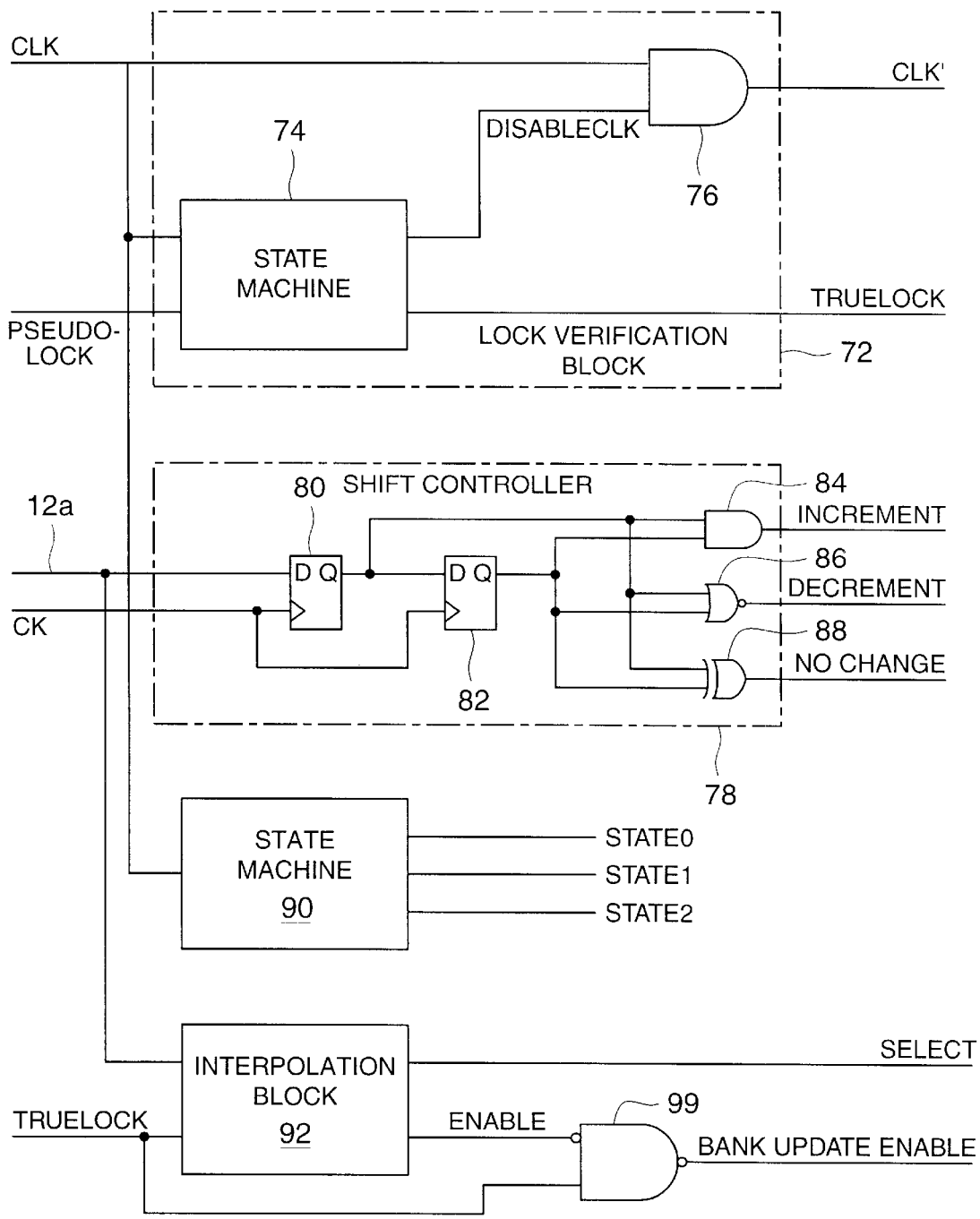
FIG. 8 is a partial block diagram of control logic for use in the delay lock loop circuit.

Referring to FIG. 8, a partial block diagram of control logic 16 is shown. Control logic 16 includes a lock verification block 72, which consists of a state machine 74 and an AND gate 76. State machine 74 receives the clock signal CLK and the PSEUDOLOCK signal, and generates a true lock indication signal (TRUELOCK). State machine 74 also generates a clock disable signal (DISABLECLK) which, when low, prevents the clock signal CLK from being passed through as clock-signal CLK' to delay block 14.

Figure 9:
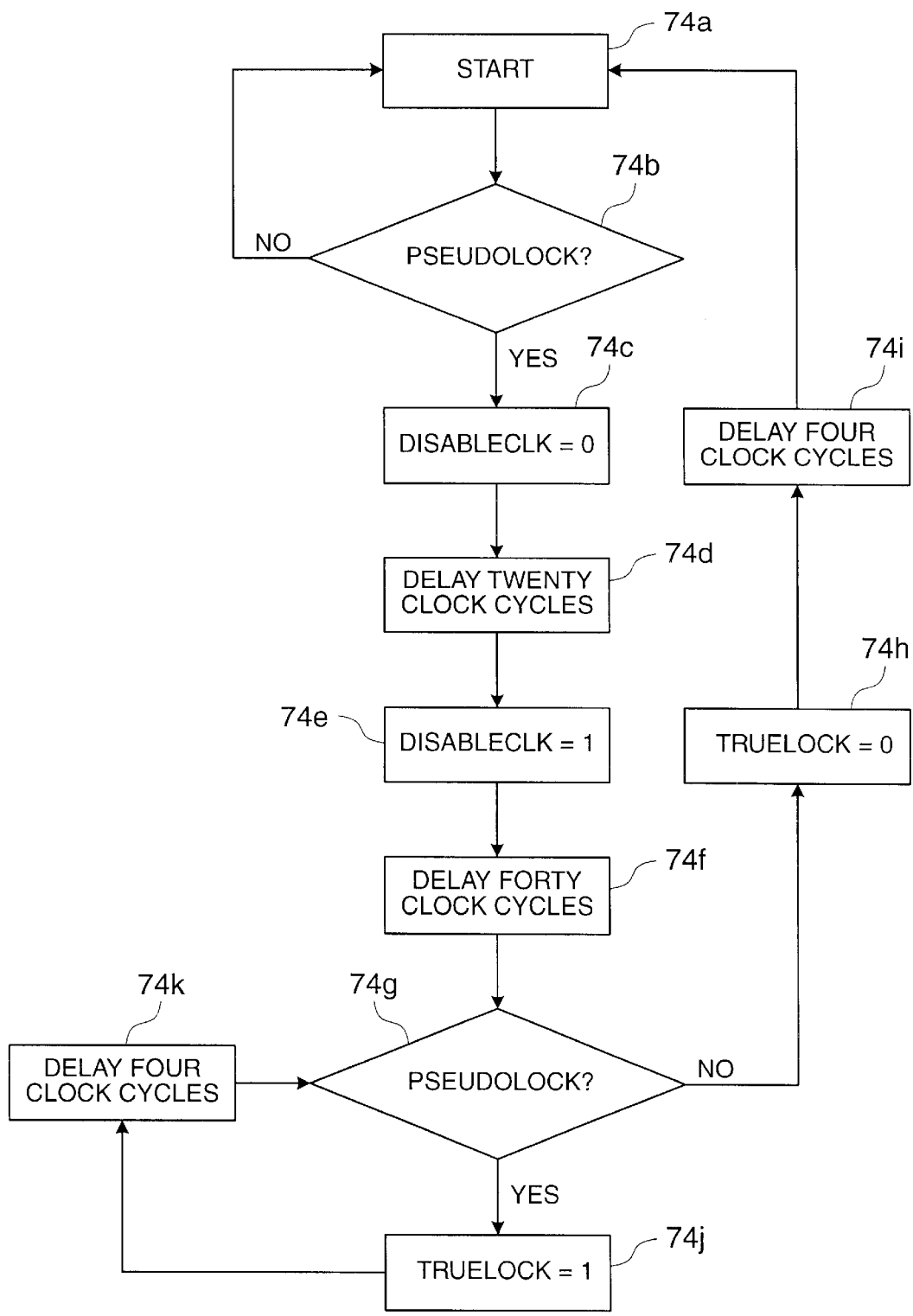
FIG. 9 is a flowchart illustrating the operation of a state machine in the control logic.

The operation of state machine 74 is illustrated in the flowchart shown in FIG. 9.

The number of clock cycles consumed in delay at various steps in the flowchart is presented for illustrative purposes only, and it will be understood that a different number of clock cycles may be used at each step.

State machine 74 begins at step 74a in an initial state in which the DISABLECLK signal is at its default value (high). At step 74b, state machine 74 determines whether the PSEUDOLOCK signal is high. If not, state machine 74 returns to its initial state and continues check for a high PSEUDOLOCK signal.

When a high PSEUDOLOCK signal is received, the DISABLECLK signal is set low at step 74c. The DISABLECLK signal is maintained low for a delay time of twenty clock cycles (step 74d). During this time, the clock signal CLK is not passed through AND gate 76 (shown in FIG. 8). Instead, the output clock signal CLK' is held low during this time. This effectively "flushes out" the delay banks of delay block 14 (shown in FIG. 1), so that all of the output signals (D1, D2, D3 and D4) go low. Phase detector 16 consequently stops registering a pseudolock and is held in reset. However, the current delay settings for the delay banks of delay block 14 are maintained, so that pseudolock may be quickly reestablished when clock signal CLK' resumes oscillating.

Returning to FIG. 9, after the delay period of twenty clock cycles at step 74d (or any sufficient number of clock cycles to flush out delay block 14), the DISABLECLK signal is returned to its default high state at step 74e. This allows the clock signal CLK' to resume oscillating at the frequency of clock signal CLK.

At step 74f, state machine 74 delays for forty clock cycles before checking to see if pseudolock has once again been acquired at step 74g. Any suitable delay period may be used at this step, so long as the delay is sufficient for the clock signal CLK to propagate through delay block 14. A high PSEUDOLOCK signal at this point indicates that the pseudolock which was acquired at step 74b was immediately reacquired after the DISABLECLK signal was returned to its default high state at step 74e. This indicates that the pseudolock is in fact a true lock (i.e. 360° phase delay). Thus, if a high PSEUDOLOCK signal is detected at step 74g, the TRUELOCK signal is set high at step 74j. A delay of four clock cycles then occurs at step 74k, after which decision step 74g is repeated. Thus, so long as a lock is maintained, the TRUELOCK signal remains high.

If a low PSEUDOLOCK signal is detected at step 74g, then at step 74h the TRUELOCK signal is set low. A delay of four clock cycles then occurs at step 74i, after which state machine 74 returns to its initial state and begins again at step 74a.

Referring to FIG. 7, the PSEUDOLOCK and TRUELOCK signals are provided as inputs to an AND gate 70. The output of AND gate 70 is clocked and provided as the FINAL LOCK signal of lock detector 17. This signal may be used by external circuitry to determine when delay lock loop circuit 10 has acquired a true lock on a 360° phase delay, so that signals D1 through D4 may be used for their intended purposes.

Returning to FIG. 8, control logic 16 also includes a shift controller 78, which receives a clock signal CK and the output signal 12a from phase detector 12. As previously described, when phase detector 12 generates a high output signal 12a, an increase in the delay time of delay block 14 is needed. Conversely, when phase detector 12 generates a low output signal 12a, a decrease in the delay time of delay block 14 is needed. Shift controller 78 provides control signals to effectuate the desired change in delay value, and also disables bank updates when dithering around the ideal delay value when a lock has been acquired.

Shift controller 78 includes two flip flops 80 and 82, which are clocked by clock signal CK and configured to act as a shift register. The output signals from flip flops 80 and 82 are provided to an AND gate 84, a NOR gate 86 and an XOR gate 88. When signal 12a remains high for two consecutive clock cycles, the output signals from flip flops 80 and 82 are both high, so that the output signal from AND gate 84 is high. This signal causes the delay in delay block 14 to be incremented. When signal 12a remains low for two consecutive clock cycles, the output signals from flip flops 80 and 82 are both low, so that the output signal from NOR gate 86 is high. This signal causes the delay in delay block 14 to be decremented.

When signal 12a is high one clock cycle and low the next, or vice versa, this indicates that no change is needed to the delay of delay block 14, since the delay value nearest to the correct value has apparently been reached. Thus, when the output signals from flip flops 80 and 82 have complementary values, the output signal from XOR gate 88 is high. This signal causes he delay in delay block 14 to be left unchanged.

Using conventional logic, the output signals from gates 84, 86 and 88 may be readily converted to the shift direction signal SDIR and shift clock signal SCLK previously described for controlling individual delay banks in delay block 14. As previously described, control logic 16 may include logic which provides individual control signals to each delay bank in delay block 14, so that the amount of delay may be incremented or decremented in one delay bank at a time. Such logic may include a state machine which selects each delay bank in order when incrementing the delay, and decrements delay in the opposite order, starting with the most recently incremented delay bank. Logic may be readily created for this task, and therefore is not described here in detail.

Control logic 16 also includes a state machine 90 which receives clock signal CLK and generates three state signals: STATE0, STATE1 and STATE2. These state signals are generated on a rotating basis as illustrated in Table B.

TABLE B

| Clock cycle | Internal State | STATE0 | STATE1 | STATE2 |
|---|---|---|---|---|
| 0 | 00 | 1 | 0 | 0 |
| 1 | 01 | 0 | 0 | 0 |
| 2 | 11 | 0 | 1 | 0 |
| 3 | 10 | 0 | 0 | 1 |
| 4 | 00 | 1 | 0 | 0 |
| 5 | 01 | 0 | 0 | 0 |
| 6 | 11 | 0 | 1 | 0 |
| 7 | 10 | 0 | 0 | 1 |

The two-bit internal state of state machine 90, from which the state signals are generated, is also shown in Table B. The generation of the internal state and output state signals by state machine 90 may be performed using conventional logic.

In this example, state machine 90 effectively divides the clock signal frequency by four in generating state signals STATE0, STATE1 and STATE2. State machine 90 is synchronized with phase detector 12, which also divides the clock signal frequency by four. Thus, for example, the clock cycle in which STATE0 is high may correspond to the clock cycle previous to the cycle in which output signal 12a of phase detector 12 is updated. State machine 90 may use some other clock frequency division factor to produce any desired signal sampling rate.

The state signals of state machine 90 may be used to synchronize events within control logic 16 and provide an orderly flow of events within each sampling period (e.g. four clock cycles). For example, the STATE0 signal may be provided to state machine 74, so that state machine 74 updates its state when STATE0 is high. It is for this reason that the flowchart shown in FIG. 9 sets forth delay times which are multiples of four clock cycles.

The STATE1 signal may be used as the clock signal CK for shift controller 78, so that the INCREMENT, DECREMENT and NO CHANGE signals are updated when STATE1 is high. The STATE2 signal may be provided to additional logic (not shown) for generating the SDIR and SCLK delay control signals. This logic, which also receives the INCREMENT, DECREMENT and NO CHANGE signals, therefore establishes the SDIR and SCLK signals when STATE2 is high.

Figure 13:
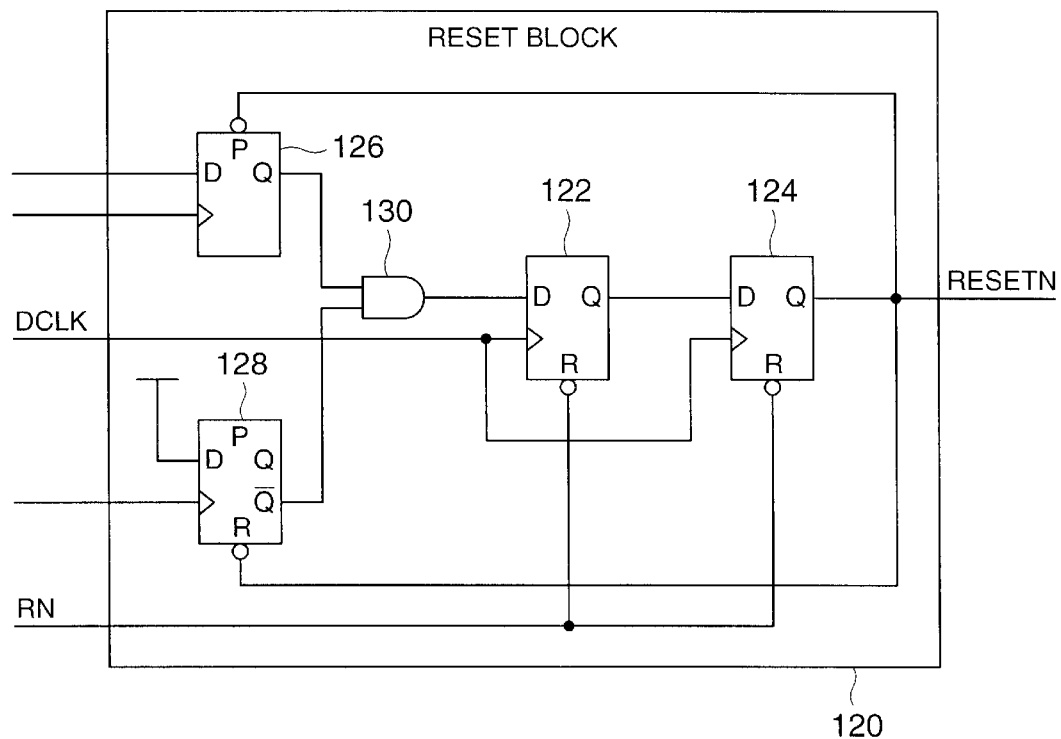
FIG. 13 is a block diagram of a reset block for in the delay lock loop circuit.

The initialization of phase detector 12 is provided by the use of reset signals. Referring to FIG. 13, a block diagram of a reset block 120 is shown. Reset block 120 receives a DLL reset signal RN and the delayed clock signal DCLK. Reset signal RN is an active-low signal, meaning that a reset is intended when RN assumes a low logic level. Reset block 120 generates a reset signal RESETN, which is also active-low.

Reset signal RN is briefly asserted to initialize delay lock loop circuit 10. Reset signal RN is provided to the reset inputs of two flip flops 122 and 124 in reset block 120. Since the output of flip flop 124 is the reset signal RESETN, the assertion of RN immediately drives RESETN low. Among other things, reset signal RESETN sets the delay of each delay bank 14a, 14b, 14c, 14d of delay block 14 (FIG. 4) to its minimum value.

Reset signal RESETN is provided to the preset and reset inputs, respectively, of two flip flops 126 and 128. The output of flip flop 126 is provided to the input of an AND gate 130. An inverted output of flip flop 128 is provided to another input of AND gate 130. Thus, when RESETN is driven low, both inputs to AND gate 130 are driven high.

The output of AND gate 130 is provided to the data input of flip flop 122. Thus, when RN is asserted, RESETN is driven low and the data input to flip flop 122 is driven high.

Flip flops 122 and 124 each receive the delayed clock signal DCLK as a clock input. The output of flip flop 122 is provided to the data input of flip flop 124. Flip flops 122 and 124 are rising edge-triggered flip flops. Thus, once reset signal RN is deasserted, the output of flip flop 122 is driven high at the first rising edge of the delayed clock signal DCLK. Reset signal RESETN is then driven high at the second rising edge of the delayed clock signal DCLK.

Thus, reset signal RESETN does not resume its normal high state until two cycles of DCLK after reset signal RN goes high. This time frame ensures that delayed clock signal DCLK, which is derived from delay block 14, follows clock signal CLK by only a minimal delay due to the above-described resetting of delay block 14.

Referring to FIG. 2, reset signal RESETN is received by phase detector 12. When RESETN is driven low, flip flops 22 and 24 (and the corresponding flip flops of frequency divider 20) are reset. Reset signal RESETN is also provided to a preset input of flip flop 28, so hat output signal 12a is driven high when RESETN is asserted.

When RESETN resumes its normal high state (after two rising edges of DCLK), phase detector 12 resumes operation. At that time, as previously noted, delayed clock signal DCLK follows clock signal CLK by only a minimal delay. Thus, when operation of phase detector 12 resumes, a rising edge of clock signal CLK is received first, followed by a rising edge of delayed clock signal DCLK. This sequence ensures that delay block 14 begins with a minimal-delay, and that phase detector 12 begins by registering a desired increase in delay. This arrangement provides stability to the initial operation of delay lock loop circuit 10.

Returning to FIG. 13, reset block 130 may assert reset signal RESETN under conditions other than those described above (i.e. the assertion of reset signal RN). For example, flip flop 126 may receive error and parity signals at its data and clock inputs, respectively, while flip flop 128 may receive an inverted version of the FINAL LOCK signal. In this manner, various conditions which are beyond the scope of this disclosure may trigger the assertion of reset signal RESETN. Reset signals RESETN and/or RN may also be used to reset state machine 90 shown in FIG. 8, to ensure that state machine 90 and phase detector 12 are properly synchronized.

It will be appreciated that delay lock loop circuit 10 as described thus far has a fixed time resolution equal to the delay time of a delay cell C(i) in each delay bank 14x (shown in FIG. 5). That is, the delay generated by delay block 14 can be changed only in increments of, for example, 200 picoseconds. Finer resolution than this is desirable.

Thus, referring to FIG. 8, control logic 16 also includes an interpolation block 92 which receives the output signal 12a from phase detector 12 and the FINAL LOCK signal. Interpolation block 92 generates a select signal and an enable signal. Interpolation block 92 allows finer time resolution for delay lock loop circuit 10, as described below.

Referring to FIG. 10, a block diagram of a delay bank 14d is shown. Delay bank 14d operates in substantially the same manner as delay bank 14x shown in FIGS. 5 and 6. Thus, only the differences between delay bank 14d and the generic delay bank 14x will be described.

The select signal from interpolation block 92 is received by delay bank 14d. Specifically, a fine resolution block 94 receives the select signal from interpolation block 92, as well as the DELAYOUT signals (see FIG. 6) from delay cells C(1) and C(0).

Figure 12:
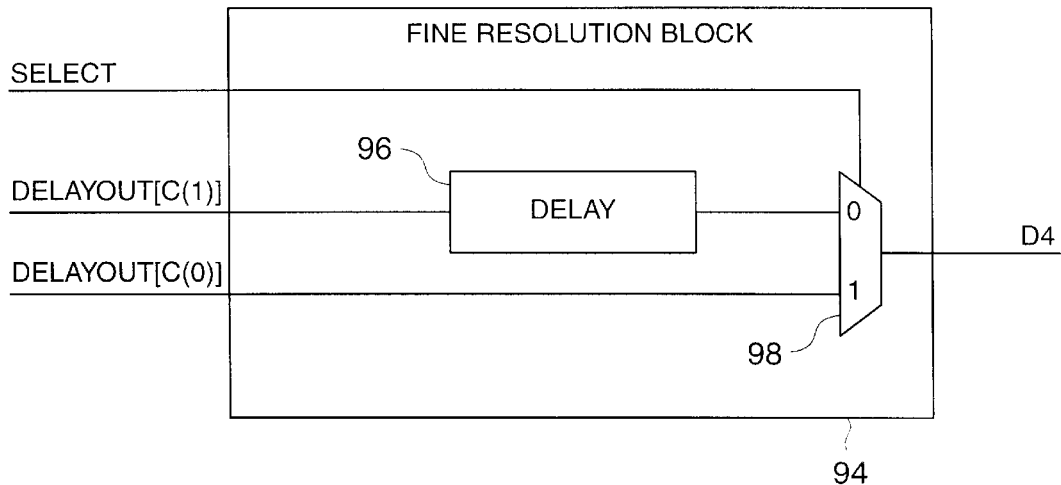
FIG. 12 is a block diagram of fine resolution block for use in the delay lock loop circuit.

Referring to FIG. 12, a block diagram of fine resolution block 94 is shown. The DELAYOUT signal from delay cell C(1) is delayed by a delay block 96 and provided to one input of a multiplexer 98. The DELAYOUT signal from delay cell C(0) is provided directly to the other input of multiplexer 98. The select signal from interpolation block 92 is provided as =the select signal for multiplexer 98.

It will be appreciated that the DELAYOUT signal from delay cell C(0) is merely a delayed version of the DELAYOUT signal from delay cell C(1). Delay cell C(0) provides a delay of, for example, 200 picoseconds as previously described. Delay block 96, which is effectively connected in parallel with delay cell C(0), provides a delay different from that provided by delay cell C(0). For example, delay block 96 may delay the DELAYOUT signal from delay cell C(1) by 300 picoseconds. Thus, the input-signals of multiplexer 98 are separated by a delay interval of 100 picoseconds, or one-half the delay provided by each delay cell C(i) in delay bank 14d.

The select signal from interpolation block 92 therefore causes multiplexer 98 to provide one of its two input signals as the output signal D4 (or DCLK) from delay bank 14d. This select signal therefore provides a finer time resolution (100 ps) than would otherwise be possible for the output signal D4.

Figure 11:
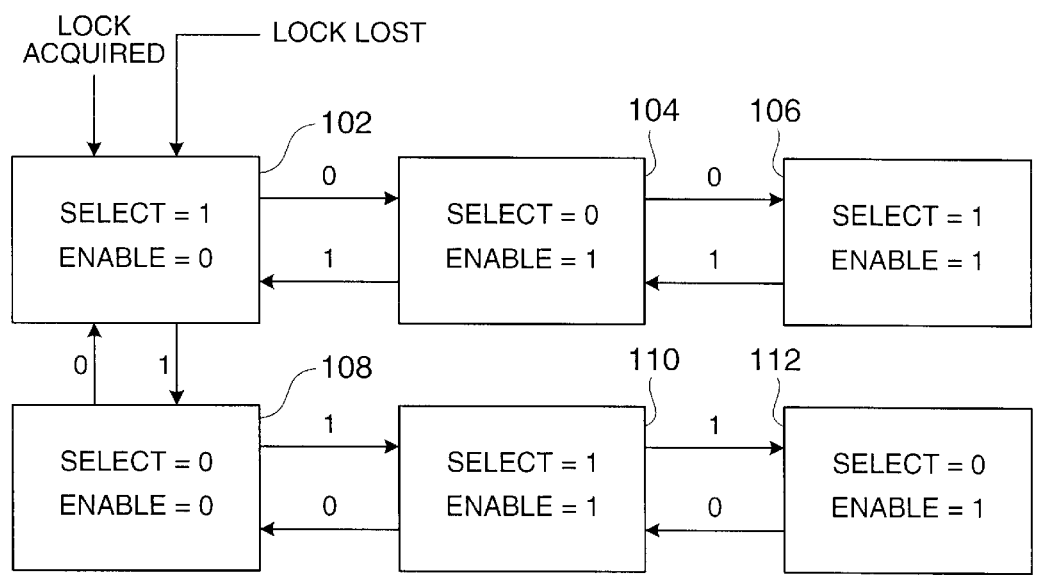
FIG. 11 is a state diagram illustrating the operation of an interpolation block in the control logic.

Referring to FIG. 11, the method by which interpolation block 92 generates its output signals is illustrated. The default state for interpolation block 92 is state 102. When delay lock loop circuit 10 is not in a state of true lock, interpolation block 92 assumes state 102. Likewise, when true lock is either acquired or lost, interpolation block 92 assumes state 102.

In state 102, the select signal has a value of one, meaning that the DELAYOUT signal from delay cell C(0) is selected by multiplexer 98 (shown in FIG. 12). In this state, delay bank 14d operates in the same manner as the generic delay bank 14x shown in FIG. 5.

In state 102, the enable signal generated by interpolation block 92 has a value of zero. Referring to FIG. 8, the enable signal is inverted and combined in a NAND operation in NAND gate 99 with the FINAL LOCK signal to generate a bank update enable signal. Thus, if the enable signal has a value of zero and the FINAL LOCK signal has a value of one (i.e. true lock acquired), the bank update enable signal has a value of zero so that bank updates are not allowed. In any other condition, the bank update enable signal has a value of one so that bank updates are allowed.

When final lock is initially acquired, interpolation block 92 assumes state 102. Since the FINAL LOCK signal is by definition high at that time, the bank update enable signal is low, disabling bank updates. This means that the logic (not shown) receiving the INCREMENT, DECREMENT and NO CHANGE signals does not generate an SCLK signal to cause any of the delay banks 14a through 14d to change their delay values.

So long as the FINAL LOCK signal remains high, interpolation block 92 moves among the states 102, 104, 106, 108, 110 and 112 shown in FIG. 11. If the FINAL LOCK signal goes low for some reason after true lock has been acquired, interpolation block 92 returns to state 102 until true lock is acquired once again. The transitions among states 102, 104, 106, 108, 110 and 112 are determined by the value of output signal 12a from phase detector 12. The value of output signal 12a is indicated adjacent to the corresponding state transition arrow to indicate the direction of transition caused by output signal 12a.

From state 102, interpolation block 92 may move to either state 104 or state 108. If output signal 12a from phase detector 12 is high, indicating that an increase in delay is desirable, interpolation block 92 moves to state 108. In this state, the enable signal remains low, so that bank updates remain disabled. However, in state 108, the select signal is low, so that multiplexer 98 (shown in FIG. 12) selects the output signal from delay block 96. This signal is delayed in comparison to the DELAYOUT signal from delay cell C(0), as previously described. Thus, in state 108, fine resolution block 94 introduces an additional delay into its output signal D4. This additional delay, as previously noted, is less than that introduced by a full delay cell increment.

From state 108, if output signal 12a from phase detector 12 remains high, indicating that a further increase in delay is desirable, interpolation block 92 moves to state 110. In this state, the select signal is returned to a high state, so that multiplexer 98 (shown in FIG. 12) once again selects the DELAYOUT signal from delay cell C(0). This results in a delay decrease of 100 picoseconds. However, in state 110, the enable signal assumes a value of one, allowing bank updates to occur. Phase detector 12 then causes delay block 14 to increase its delay by one delay cell (i.e. 200 ps). Thus, a net delay increase of 100 ps is effected by the transition to state 110.

From state 110, if output signal 12a from phase detector 12 still remains high, indicating that a still further increase in delay is desirable, interpolation block 92 moves to state 112. In this state, the enable signal remains high, allowing bank updates to occur. However, before the next bank update occurs, the select signal assumes a value of zero, so that multiplexer 98 (shown in FIG. 12) selects the output signal from delay block 96. This results in a delay increase of 100 picoseconds.

A low phase detector output signal 12a will cause a transition from state 112 to state 110, then (if it persists) to state 108, then (if it still persists) to state 102, with a corresponding decrease in delay at each step.

Returning to state 102, if output signal 12a from phase detector 12 is low, indicating that a decrease in delay is desirable, interpolation block 92 moves to state 104. In this state, the select signal assumes a value of zero, so that multiplexer 98 (shown in FIG. 12) selects the output signal from delay block 96. This results in a delay increase of 100 picoseconds. However, in state 104, the enable signal assumes a value of one, allowing bank updates to occur. Phase detector 12 then causes delay block 14 to decrease its delay by one delay cell (i.e. 200 ps). Thus, a net delay decrease of 100 ps is effected by the transition to state 104.

From state 104, if output signal 12a from phase detector 12 remains low, indicating that a further decrease in delay is desirable, interpolation block 92 moves to state 106. In this state, the enable signal remains high, allowing bank updates to occur. However, before the next bank update occurs, the select signal assumes a value of one, so that multiplexer 98 (shown in FIG. 12) selects the DELAYOUT signal from delay cell C(0). This results in a delay decrease of 100 picoseconds.

A high phase detector output signal 12a will cause a transition from state 106 to state 104, then (if it persists) to state 102, with a corresponding increase in delay at each step.

In this manner, interpolation block 92 may move among states 102, 104, 106, 108, 110 and 112 without a loss of true lock. These state transitions give delay lock loop circuit 10 a resolution twice as fine as that permitted by the standard delay cell increments. Thus, true lock may be acquired quickly and then adjusted with fine resolution.

Although the present invention and its advantages have been described in detail, it should be understood that various changes, substitutions, and alterations can be made therein without departing from the spirit and scope of the invention as defined by the appended claims.

What is claimed is:

1. A delay lock loop circuit comprising:

a delay block coupled to receive a clock signal and operable to delay the clock signal by a elected delay amount to generate a delayed clock signal;

a phase detector coupled to receive the clock signal and the delayed clock signal, and operable to compare phases of the clock signal and the delayed clock signal, and operable to generate a phase comparison signal in response to the phase comparison;

a lock detector coupled to receive the clock signal and the delayed clock signal, and operable to compare timing of the clock signal and the delayed clock signal, and operable to generate a potential lock indication signal in response to the timing comparison;

a controller coupled to receive the phase comparison signal and the potential lock indication signal, and operable to provide a delay control signal to the delay block to change the selected delay amount in response to the phase comparison signal, and operable to interrupt the clock signal to the delay block for a selected interval in response to the potential lock indication signal, and operable to generate a true lock indication signal in response to the potential lock indication signal subsequent to the interruption of the clock signal to the delay block.

2. The delay lock loop circuit of claim 1, wherein the phase detector comprises:

a first frequency division block coupled to receive the clock signal and operable to generate an output signal having a frequency equal to a divisor of a frequency of the clock signal;

a second frequency division block coupled to receive the delayed clock signal and operable to generate an output signal having a frequency equal to a divisor of a frequency of the delayed clock signal; and a phase comparator coupled to receive the output signals of the first and second frequency division blocks, and operable to compare phases of the output signals of the first and second frequency division blocks, and operable to generate the phase comparison signal in response to the comparison of the phases of the output signals of the first and second frequency division blocks.

3. The delay lock loop circuit of claim 1, wherein the delay block comprises:

a plurality of delay cells coupled in series, each delay cells being operable to delay the clock signal by a first predetermined delay period; and an alternative delay cell coupled in parallel with a preselected one of the delay cells, the alternative delay cell being operable to delay the clock signal by a second predetermined delay period different from the first predetermined delay period;

and wherein the controller comprises an interpolation block coupled to receive the phase comparison signal and the true lock indication signal, and operable to select either the alternative delay cell or the preselected one of the delay cells in response to the phase comparison signal and the true lock indication signal.

4. A delay lock loop circuit comprising:

a delay block coupled to receive a clock signal and operable to delay the clock signal by a selected delay amount to generate a delayed clock signal;

a phase detector coupled to receive the clock signal and the delayed clock signal, the phase detector having:

a first frequency division block coupled to receive the clock signal and operable to generate an output signal having a frequency equal to a divisor of a frequency of the clock signal;

a second frequency division block coupled to receive the delayed clock signal and operable to generate an output signal having a frequency equal to a divisor of a frequency of the delayed clock signal; and a phase comparator coupled to receive the output signals of the first and second frequency division blocks, and operable to compare phases of the output signals of the first and second frequency division blocks, and operable to generate a phase comparison signal in response to the comparison of the phases of the output signals of the first and second frequency division blocks;

a lock detector coupled to receive the clock signal and the delayed clock signal, and operable to compare timing of the clock signal and the delayed clock signal, and operable to generate a potential lock indication signal in response to the timing comparison;

a controller coupled to receive the phase comparison signal and the potential lock indication signal, and operable to provide a delay control signal to the delay block to change the selected delay amount in response to the phase comparison signal, and operable to interrupt the clock signal to the delay block for a selected interval in response to the potential lock indication signal, and operable to generate a true lock indication signal in response to the potential lock indication signal subsequent to the interruption of the clock signal to the delay block.

5. A method for generating a delayed clock signal from a clock signal, comprising:

delaying the clock signal by a selected delay amount to generate the delayed clock signal;

comparing phases of the clock signal and the delayed clock signal by a phase detector;

generating a phase comparison signal in response to the phase comparison by the phase detector;

comparing timing of the clock signal and the delayed clock signal by a lock detector;

generating a potential lock indication signal in response to the timing comparison by the lock detector;

providing a delay control signal to the delay block by a controller to change the selected delay amount in response to the phase comparison signal;

interrupting the clock signal to the delay block by the controller for a selected interval in response to the potential lock indication signal; and generating a true lock indication signal by the controller in response to the potential lock indication signal subsequent to the interruption of the clock signal to the delay block.

6. The method of claim 5, wherein comparing phases of the clock signal and the delayed clock signal by the phase detector comprises:

dividing the frequency of the clock signal by a first frequency division block to generate a first output signal;

dividing the frequency of the delayed clock signal by a second frequency division block to generate a second output signal;

compare phases of the first and second output signals by a phase comparator; and generating the phase comparison signal in response to the comparison of the phases of the first and second output signals.

* * * * *